(12) United States Patent
Dauleh et al.

(10) Patent No.: US 11,525,863 B2
(45) Date of Patent: Dec. 13, 2022

(54) RECHARGEABLE ENERGY STORAGE SYSTEM WITH RADIO FREQUENCY SIGNAL DIRECTING COMPONENT AND METHOD OF MANUFACTURING

(71) Applicant: GM GLOBAL TECHNOLOGY OPERATIONS LLC, Detroit, MI (US)

(72) Inventors: Omar Dauleh, Royal Oak, MI (US); Aseim M. Elfrgani, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 77 days.

(21) Appl. No.: 17/173,221

(22) Filed: Feb. 11, 2021

(65) Prior Publication Data
US 2022/0252673 A1   Aug. 11, 2022

(51) Int. Cl.
*G01R 31/382* (2019.01)
*H01M 10/46* (2006.01)
*H01M 10/42* (2006.01)
*H01M 10/48* (2006.01)

(52) U.S. Cl.
CPC ........ *G01R 31/382* (2019.01); *H01M 10/425* (2013.01); *H01M 10/46* (2013.01); *H01M 10/48* (2013.01); *H01M 2010/4278* (2013.01)

(58) Field of Classification Search
None
See application file for complete search history.

(56) References Cited

U.S. PATENT DOCUMENTS 7,495,414 B2 *  2/2009  Hui .................. H01F 38/14
320/108

FOREIGN PATENT DOCUMENTS

WO   WO-2006001557 A1 *  1/2006  .............. H02J 7/025

* cited by examiner

*Primary Examiner* — Roy Y Yi
(74) *Attorney, Agent, or Firm* — Quinn IP Law

(57) ABSTRACT

A rechargeable energy storage system and a method of manufacturing includes a battery pack having a battery cell module assembly with an interconnect board disposed between and physically connecting the battery cells with the cell monitoring unit, and a module cover at least partially enclosing the battery cells, the cell monitoring unit, and the interconnect board. The battery pack has relatively high and relatively low loss regions for radio frequency signal communication. A radio frequency manager is wirelessly connectable to the cell monitoring unit by radio frequency signal communication. A signal directing component is operable for transmitting and/or receiving a radio frequency signal between the cell monitoring unit and the radio frequency manager, is configured to direct the radio frequency signal to the relatively low loss region, and is integrated in one of the module cover, the interconnect board, or the radio frequency manager.

18 Claims, 7 Drawing Sheets

RECHARGEABLE ENERGY STORAGE SYSTEM WITH RADIO FREQUENCY SIGNAL DIRECTING COMPONENT AND METHOD OF MANUFACTURING

INTRODUCTION

The present disclosure generally relates to a rechargeable energy storage system with a signal directing component, such as an antenna, a reflector, or a lens, for directing radio frequency signals between a cell monitoring unit and a radio frequency manager with relatively low loss and improved packaging space, and a method of manufacturing the rechargeable energy storage system.

A rechargeable energy storage system, such as an electrical energy storage system for powering an electric or hybrid vehicle, includes a battery pack that has a battery cell module assembly, which may be one of multiple battery cell module assemblies. The battery cell module assembly includes a plurality of battery cells and a cell monitoring unit. The battery pack also includes a radio frequency manager (also referred to as a battery radio frequency manager). Cell data, such as individual cell voltages and charging and discharging currents, is monitored by the cell monitoring unit and is communicated wirelessly via radio frequency communication to the battery radio frequency manager. The battery radio frequency manager is typically wired to an electronic control unit (which may be referred to as a controller) that controls operation (charging and discharging) of the battery cells in relation to various operating modes of the vehicle powertrain.

The reliability of the wireless communication between the battery cell module assembly or assemblies and the battery radio frequency manager depends upon the signal strength and the signal losses inherent in the electrically complex system.

SUMMARY

A rechargeable energy storage system is provided that utilizes a radio frequency signal directing component specifically configured to direct the wireless signal through a relatively low loss region of a battery pack to improve radio frequency signal communication. Radio frequency analysis conducted on a rechargeable energy storage system may inform relatively high loss regions and relatively low loss regions from principal radiation planes of the antenna. A radio frequency directing component as disclosed herein takes advantage of the relatively low loss region to enable high signal strength. Additionally, the signal directing component may be integrated in a substrate of a high dielectric loss material with low loss tangent to reduce packaging space requirements and assembly process steps.

A rechargeable energy storage system includes a battery pack that may have multiple battery cell module assemblies. Each battery cell module assembly has a plurality of battery cells and a cell monitoring unit. The cell monitoring unit includes a printed circuit board configured to monitor one or more parameters of the battery cells. The battery cell module assembly also includes an interconnect board disposed between the plurality of battery cells and the cell monitoring unit and physically connecting the plurality of battery cells with the cell monitoring unit. The battery cell module assembly includes a module cover at least partially enclosing the plurality of battery cells, the cell monitoring unit, and the interconnect board, with the cell monitoring unit disposed adjacent to the module cover. The battery pack has a relatively high loss region for radio frequency signal communication and a relatively low loss region for radio frequency signal communication. A radio frequency manager is wirelessly connectable to the cell monitoring unit(s) of the battery cell module assembl(ies) by radio frequency signal communication. A signal directing component is operable for transmitting and/or receiving a radio frequency signal between the cell monitoring unit(s) of the battery cell module assembl(ies) and the radio frequency manager and is configured to direct the radio frequency signal to the relatively low loss region, resulting in increased signal strength or decreased signal losses and accompanying more reliable wireless communication in comparison to other paths for the radio frequency signal. The signal directing component is integrated in one of the module cover, the interconnect board, or the radio frequency manager. Notably, the signal directing component is not in the printed circuit board of the cell monitoring unit, which may be relatively expensive and complex to customize or reconfigure with a signal directing component in comparison to the other components. By locating the signal directing unit elsewhere, the same printed circuit board may be used in different applications, such as different vehicle powertrain layouts, without modification of the printed circuit board being necessary to account for the different radio frequency signal patterns of the different applications.

In some embodiments, the signal directing component is an antenna. For example, the signal directing component may be a directional antenna integrated in the module cover. A directional antenna radiates and receives radio frequency signal power with greater intensity in one direction than in any other direction, in contrast to an omnidirectional antenna that radiates and receives radio frequency signal power with substantially equal intensity in all directions. While an omnidirectional antenna is useful in that it may be utilized in many differently configured systems, a directional antenna, if oriented with its high intensity direction in a relatively low loss region, may provide a stronger radio frequency signal even when a smaller physical size than an omnidirectional antenna.

In other embodiments, the signal directing component may be a pair of directional antennas oriented with high gain directions opposed to one another and integrated in the radio frequency manager. Because radio frequency managers of a given design are often used with differently configured battery packs, any embodiment herein in which the signal directing component is integrated in the radio frequency manager may tend to provide greater design flexibility and economies of scale.

In still other embodiments, the signal directing component may be a pair of directional antennas oriented with high gain directions opposed to one another, one of the directional antennas being an enabled directional antenna and the other being an inactive directional antenna, the enabled directional antenna resulting in a stronger radio frequency signal between the cell monitoring unit and the radio frequency manager. For example, battery cell module assemblies within the battery pack may be disposed in different orientations relative to the position of the radio frequency manager, or may be disposed in different orientations in different applications, such as on different vehicles. One of the antennas may result in a stronger radio frequency signal with the battery cell module assembly in one of the orientations while the other results in a stronger radio frequency signal with the battery cell module assembly in the other orientation. Accordingly, by activating the correct antenna (e.g., the one resulting on the stronger radio frequency signal) in each application, the same configuration of a pair of directional antennas and packaging location may be used for multiple different battery pack configurations or vehicle applications. In some implementations, the pair of directional antennas with only one activated may be integrated in the module cover, while in other implementations, they may be integrated in the radio frequency manager.

In still other embodiments, the signal directing component may be a bidirectional antenna integrated in the module cover or in the radio frequency manager. The bidirectional antenna has two high gain directions opposed to one another. Although only one direction may be oriented in a path for radio frequency signal communication between the cell monitoring unit and the radio frequency manager, the bidirectional antenna of the same design may be used in different applications as it provides the design flexibility of having two high gain directions.

Instead of an antenna, the signal directing component may be a reflector. In one embodiment, the reflector may be integrated in the interconnect board. For example, the printed circuit board of the cell monitoring unit may include an antenna, such as an omnidirectional antenna that is not specifically configured to provide a high gain in a low radio frequency signal loss region of the system. However, the reflector may be oriented to direct the radio frequency signal from the antenna of the printed circuit board of the cell monitoring unit to the relatively low radio frequency signal loss region. Thus, the antenna of the more complex printed circuit board, whether directional or omnidirectional, may be used for many applications with different signal loss patterns, while the reflector in the interconnect board is customized to direct the radio frequency signal based on the specific radio frequency signal loss pattern of the application. In another embodiment, the signal directing component may be a reflector integrated in a housing of the radio frequency manager and oriented to direct the radio frequency signal from an antenna of a printed circuit board of the radio frequency manager to the relatively low radio frequency signal loss region.

As another alternative, the signal directing component may be a lens integrated in the module cover, and the lens may be oriented to direct the radio frequency signal from the antenna of the printed circuit board of the cell monitoring unit to the relatively low radio frequency signal loss region.

Other features may be implemented to further improve signal strength and ease of manufacture. For example, the signal directing component may be integrated in a substrate that is then embedded in the module cover, the interconnect board, or the radio frequency manager. This enables the signal directing component to be prepackaged in the substrate, with a known packaging space, and which may be more easily implemented in the appropriate larger component (e.g., the module cover, interconnect board, or radio frequency manager) by overmolding, for example. The substrate may be a first material, embedded in a second material of the module cover, the interconnect board, or the radio frequency manager, and the first material may have a higher dielectric constant than the second material and a lower loss tangent than the second material. This enables the signal directing component to be miniaturized (e.g., reduced in size) and packaged closer to the surface of the substrate to maintain radio frequency signal gains. Additionally, the substrate may have retention features operable to retain the substrate in a fixed position during embedding of the substrate (with the signal directing component integrated therewith) in the module cover, the interconnect board, or the radio frequency manager. The specific orientation for the signal directing component to result in the low radio frequency signal loss path may thus be more easily and accurately implemented.

In some embodiments, an electrical connector may extend out of the substrate from the signal directing component and may be embedded with the substrate in the module cover or the interconnect board such that an end of the electrical connector extends out of the module cover or the interconnect board and is connectable to or through the cell monitoring unit. Accordingly, the signal directing component, the substrate, and the electrical connector may be provided as a preassembled module for relatively easy overmolding in the larger footprint of the module cover or the interconnect board and connection to the cell monitoring unit.

In some implementations, multiple ones of the above-described signal directing components for high signal strength and low losses may be used. For example, a directional antenna may be used in each the battery cell module assembly (e.g., in either the module cover or the interconnect board) and in the radio frequency manager, such as in a housing of the radio frequency manager.

A method of manufacturing a rechargeable energy storage system includes integrating a signal directing component operable for transmitting and/or receiving a radio frequency signal between a cell monitoring unit of a battery cell module assembly and a radio frequency manager into one of a module cover of the battery cell module assembly, an interconnect board of the battery cell module assembly, or the radio frequency manager. The interconnect board is configured to be disposed between and physically connect the battery cells of the battery cell module and the cell monitoring unit, and the cell monitoring unit is configured to be disposed between the interconnect board and the module cover. Integrating the signal directing component includes orienting the signal directing component in the module cover, the interconnect board, or the radio frequency manager to direct the radio frequency signal through a relatively low loss region for radio frequency signal communication of the battery pack. For example, the method may include conducting radio frequency analysis to determine the relatively low loss region of the battery pack prior to integrating the signal directing component. The radio frequency analysis may be accomplished using an omnidirectional antenna, for example.

In some implementations, the method may include integrating the signal directing component with a substrate prior to integrating the signal directing component into the module cover, the interconnect board, or the radio frequency manager. Integrating the signal directing component into the module cover, the interconnect board, or the radio frequency manager may then include embedding the substrate in the module cover, the interconnect board, or the radio frequency manager. The substrate may be a first material, and the module cover, the interconnect board, or the radio frequency manager in which the substrate is embedded may be a second material. The first material may have a higher dielectric constant than the second material and a lower loss tangent than the second material.

An integral electrical connector may extend from the signal directing component, and the method may include connecting the integral electrical connector with the cell monitoring unit or the interconnect board after integrating the signal directing component.

In some implementations, the signal directing component may be a pair of directional antennas oriented with high gain directions opposed to one another, the pair including a first antenna and a second antenna, and the method may include determining which one of the first antenna and the second antenna results in a stronger radio frequency signal between the cell monitoring unit and the radio frequency manager, and then enabling a radio frequency path between the cell monitoring unit and the radio frequency manager for only that one of the first antenna and the second antenna that results in the stronger radio frequency signal between the cell monitoring unit and the radio frequency manager.

The above features and advantages and other features and advantages of the present disclosure are readily apparent from the following detailed description of the best modes for carrying out the disclosure when taken in connection with the accompanying drawings.

DETAILED DESCRIPTION

Figure 1:
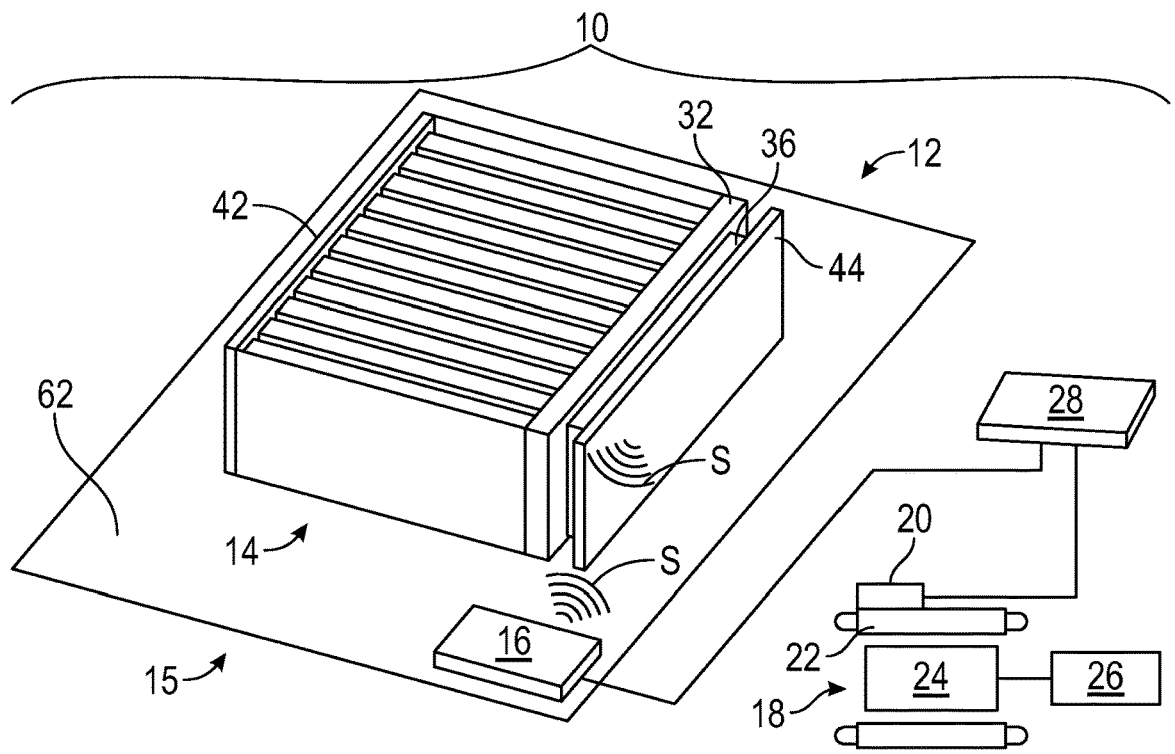
FIG. 1 is a diagram of a vehicle powertrain having a rechargeable energy storage system (RESS) including a battery pack with a battery cell module assembly (BCMA) and a radio frequency manager configured to communicate wirelessly with the BCMA.

FIG. 1 is a schematic diagram of a vehicle powertrain 10 including a rechargeable energy storage system (RESS) 12. The vehicle powertrain 10 may be for an electric vehicle (e.g., a powertrain including solely electrical power sources for motive power, such as electric motor/generators), or a hybrid electric vehicle (e.g., a powertrain including both an electrical power source used for propulsion, and another power source for propulsion, such as an internal combustion engine or a fuel cell, for example). The RESS 12 includes a battery pack that includes multiple battery cell module assemblies (BCMA) 14 (one shown) and a radio frequency manager 16 configured to communicate wirelessly with the BCMA 14, as indicated by wireless radio frequency signal S. Although just one BCMA 14 is shown for purposes of discussion, other like BCMAs may be arranged side-by-side, in rows, etc., in the battery pack 15. For example, there may be sixteen, twenty-eight, or another number of BCMAs in the battery pack 15. Furthermore, in some implementations, the RESS 12 may include multiple battery packs. In most such wireless communications, the BCMA 14 is transmitting the radio frequency signal (e.g., acting as a transmitter) while the radio frequency manager 16 is receiving the signal (e.g., acting as a receiver), but in some instances the radio frequency manager 16 sends the wireless signal to the BCMA 14 (e.g., acts as a transmitter while the BCMA 14 acts as a receiver).

The battery pack 15 provides electrical energy to one or more power sources, such as a motor-generator 18 which provides motive torque to a load 26, such as a vehicle drive train. More specifically, a motor controller 20 controls receipt of (or transmission from) electrical energy by a stator 22, which powers a rotor 24 operatively connected to the load 26 and may act as a generator, such as during regenerative braking. The battery pack 15 is rechargeable such as by capturing braking energy while operating the motor-generator 18 as a generator to convert rotational torque to electrical energy. A controller 28 receives data indicative of operating parameters of the BCMAs 14, such as cell voltages and charging and discharging currents, via signals from the radio frequency manager 16 and may be physically connected thereto (e.g., wired to the radio frequency manager 16). Although shown as a single controller 28, there may be multiple controllers interconnected as a control system. The same or a different controller 28 may also receive other vehicle information, such as acceleration and braking demands, and may command operation of the motor-generator 18 by sending control signals to the motor controller 20.

Figure 2:
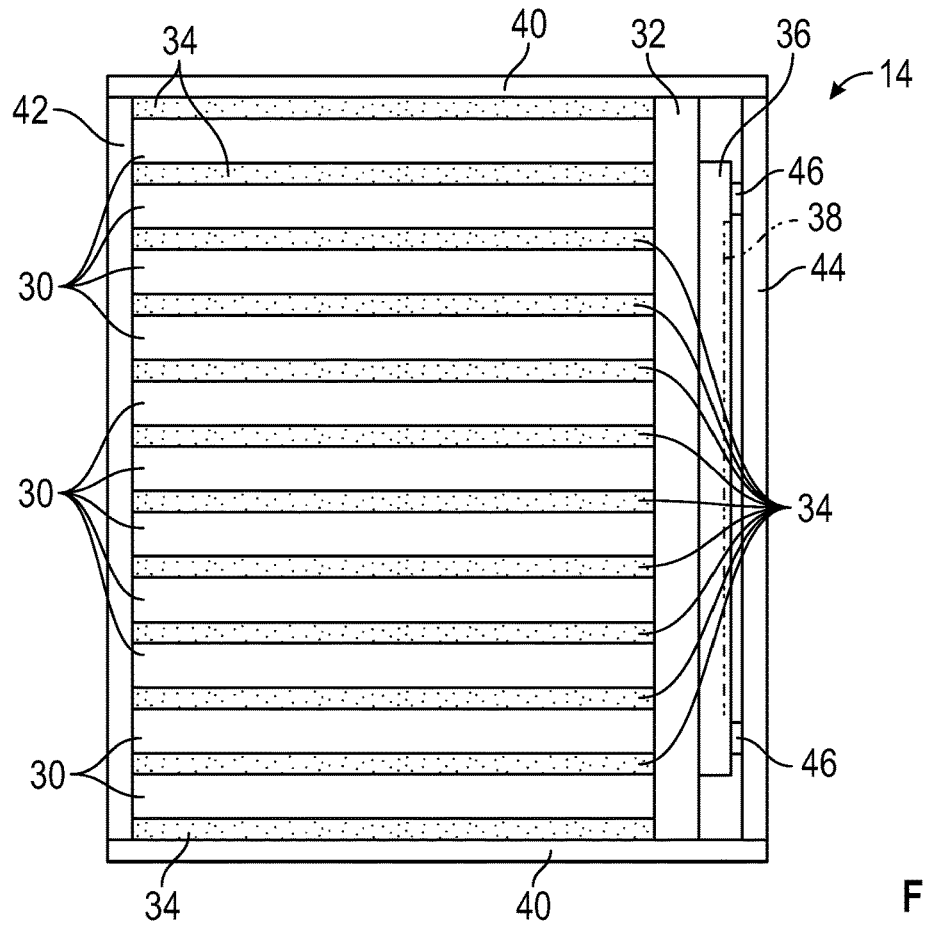
FIG. 2 is a plan view of a battery cell module assembly (BCMA) included in the battery pack of FIG. 1.

FIG. 2 is a plan view of one of the BCMAs 14 included in the RESS 12 of FIG. 1. The BCMA 14 includes a plurality of battery cells 30. The battery cells 30 may be connected in series with one another to an interconnect board 32. Adjacent battery cells 30 may be stacked against one another, or may be separated by gaps or by foam 34, for example. The BCMA 14 includes a cell monitoring unit 36 that has a printed circuit board 38 (represented in phantom) configured to monitor one or more parameters of the battery cells 30. The interconnect board 32 is disposed between the plurality of battery cells 30 and the cell monitoring unit 36 and includes electronic components that physically connect the plurality of battery cells 30 with the cell monitoring unit 36 and the printed circuit board 38 thereon. End plates 40 may enclose the battery cells 30 at opposing sides of the BCMA 14. An outer cage 42 may extend around the bottom and the remaining sides (sides of the cage 42 shown in FIG. 5 but not shown in FIG. 2 to reveal the battery cells 30). The end plates 40 are not shown in FIG. 1. A cage 62 of the battery pack 15 supports and encloses the multiple BCMAs.

A module cover 44 is disposed adjacent to the cell monitoring unit 36 and at least partially encloses the plurality of battery cells 30, the cell monitoring unit 36, and the interconnect board 32. The module cover 44 may secure to the end plates 40 and the portions of the outer cage 42 extending orthogonally to the end plates 40 for example. Standoffs 46 configured integrally with the module cover 44 may space the inner side of the module cover 44 slightly apart from the outer side of the cell monitoring unit 36 on which the printed circuit board 38 may be disposed.

One or more antennas are used to communicate data from the cell monitoring unit 36 of the BCMA 14 to the radio frequency manager 16. In most instances, wireless signals are transmitted from the cell monitoring unit 36 to the radio frequency manager 16 via the one or more antennas of the BCMA 14 so that the BCMA 14 operates as a transmitter and the radio frequency manager 16 operates as a receiver. In some modes, an antenna included in the radio frequency manager 16 may also transmit control signals from the controller 28 to the cell monitoring unit 36 so that the radio frequency manager 16 operates as a transmitter and the BCMA 14 operates as a receiver. Stated differently, the radio frequency manager 16 is a wireless manager capable of both receiving wireless signals from the cell monitoring unit 36 and providing corresponding wired signals to the controller 28, and transmitting wireless signals to the cell monitoring unit 36 as instructed by wired control signals from the controller 28. Likewise, the cell monitoring unit 36 is capable of both transmitting wireless signals to the radio frequency manager 16 and receiving wireless signals from the radio frequency manager 16.

During the initial design of the RESS 12, a radio frequency analysis may be undertaken to determine a relatively high loss region or regions and a relatively low loss region or regions of the battery pack 15. For example, the radiation patterns of the major radiation planes of an omnidirectional antenna included in the printed circuit board 38 of the cell monitoring unit 36 of the BCMAs 14 may be studied to determine relative signal strengths at different portions of the patterns. A relatively low loss region of the battery pack 15 for radio frequency signal communication corresponds with the relatively stronger signal portion of the radiation pattern, and a relatively high loss region of the battery pack 15 for radio frequency signal communication corresponds with the relatively weaker signal portion of the radiation pattern. Interference from electronic components of the cell monitoring unit 36 or structural components of the battery pack 15 may influence the radiation pattern and the resulting relatively high loss region and relatively low loss region.

Additionally, placement of the radio frequency manager 16 within the battery pack 15 relative to the BCMA 14 may be based upon available packaging space or other considerations so that the relative position of the radio frequency manager 16 to the BCMA 14 and the transmitting component(s) therein may be different in different vehicles. For example, in some implementations, the radio frequency manager 16 may be positioned relative to the BCMA 14 as shown in FIG. 1. In other implementations, the BCMA 14 could be disposed in an orientation 180 degrees different from that of FIG. 1, e.g., with the module cover 44 facing the opposite direction. In addition to the relatively high and relatively low loss regions determined by radio frequency analysis, the relative positioning of the BCMA 14 and the radio frequency manager 16 may also influence how to optimize the BCMA 14 and/or the radio frequency manager 16 to achieve a strong wireless signal for radio frequency signal communication.

Based at least in part upon these factors and considerations, the battery pack 15 as disclosed in the various embodiments herein is equipped with a signal directing component operable for transmitting and/or receiving a radio frequency signal between the cell monitoring unit 36 and the radio frequency manager 16 and configured to direct the radio frequency signal to the relatively low loss region. In the embodiments disclosed herein, the signal directing component is integrated in the module cover, the interconnect board, or the radio frequency manager. Notably, the signal directing component is not integrated in the cell monitoring unit 36 or the printed circuit board 38 included thereon. This allows a given printed circuit board design to be used in more than battery pack configuration. Stated differently, the expense of configuring and producing a different printed circuit board design for each battery pack configuration may be avoided and, instead, the same printed circuit board may be used in different battery pack configurations in part due to the customization of the battery pack by the signal directing components discussed herein.

Figure 3:
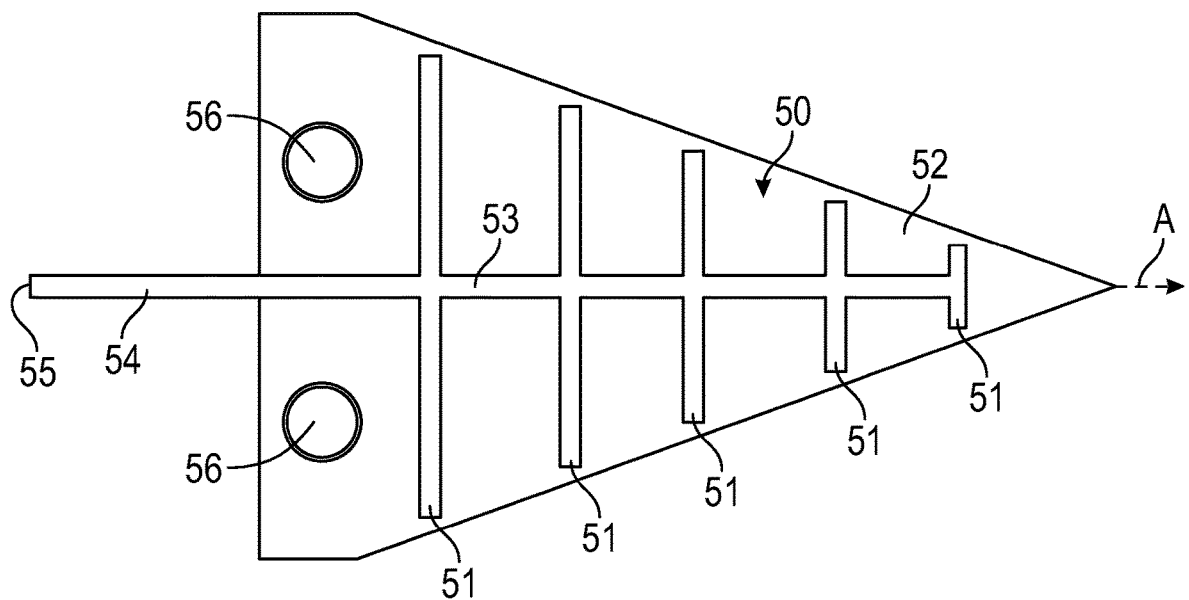
FIG. 3 is a plan view of a first embodiment of a signal directing component configured as a directional antenna, the directional antenna integrated in a substrate and an integrated flexible electrical connector extending from the directional antenna and out of the substrate.

FIG. 3 shows a first embodiment of a signal directing component that is a directional antenna 50. The directional antenna 50 is shown integrated with a substrate 52 as a unitary component, and configured as a log periodic dipole antenna with a series of dipole elements 51 (also referred to as arms) and a conductive line 53 interconnecting the elements. The radiation pattern that results when the antenna 50 is electrically excited results in a radio frequency signal that is strongest in the direction of arrow A. Although a log periodic dipole antenna is shown, other types of directional antennas, such as other surface mounted antennas, may instead be used that result in a single direction of greatest radio frequency signal strength, in contrast to an omnidirectional antenna that radiates and receives radio frequency signal power with substantially equal intensity in all directions, or a bidirectional antenna that results in opposing directions of substantially equal radio frequency signal strength.

The directional antenna 50 may be printed on the surface of the substrate 52 or embedded within (e.g., overmolded within) the substrate 52 to integrate the directional antenna 50 with the substrate 52. The directional antenna 50 is integrated in the substrate 52 so that an electrical connector 54 extends out of the substrate 52 from the directional antenna 50. The electrical connector 54 may also be referred to as a feed, and is shown extending from the conductive line 53. Stated differently, the electrical connector 54 is integral with the antenna 50 and the substrate 52, and is also flexible, allowing it to be bent or turned so that the end 55 of the electrical connector 54 can be connected to an adjacent (e.g., overlying or underlying) electrical component as discussed herein. The antenna 50 is a material that is a good conductor, such as copper or aluminum, for emitting the radio frequency signal. The substrate 52 is an electrostatic discharge protecting material with a high dielectric constant and a low loss tangent that helps to enable miniaturization of the size of the antenna 50. For example, the material of the substrate 52 may be silicone rubber or a ceramic laminate (e.g., alumina, polytetrafluoroethylene (PTFE) ceramic or other).

The substrate 52 is configured with retention features 56. In the embodiment shown, the retention features 56 are apertures molded into, drilled, or otherwise provided in the substrate 52. The retention features 56 are used to retain the substrate 52 in a fixed position during embedding of the substrate 52 in the module cover 44, the interconnect board 32, or the radio frequency manager 16 in order to ensure that the signal directing component (e.g., the antenna 50) is oriented to achieve the strongest radio frequency signal that is directed to and through the relatively low loss region of the battery pack 15. For example, pins or dowels may extend through the apertures 56 during overmolding of the material of the module cover 44, the interconnect board 32, or the housing of the radio frequency manager 16 over the substrate 52 in the various embodiments of substrates 52, 52A, 52E, 52F, and 52G, with retention features 56 disclosed herein. In other embodiments, the retention features may include heat stake posts routed through the apertures, or may include fasteners connected to the substrate 52, 52A, 52E, 52F, or 52G.

Figure 4:
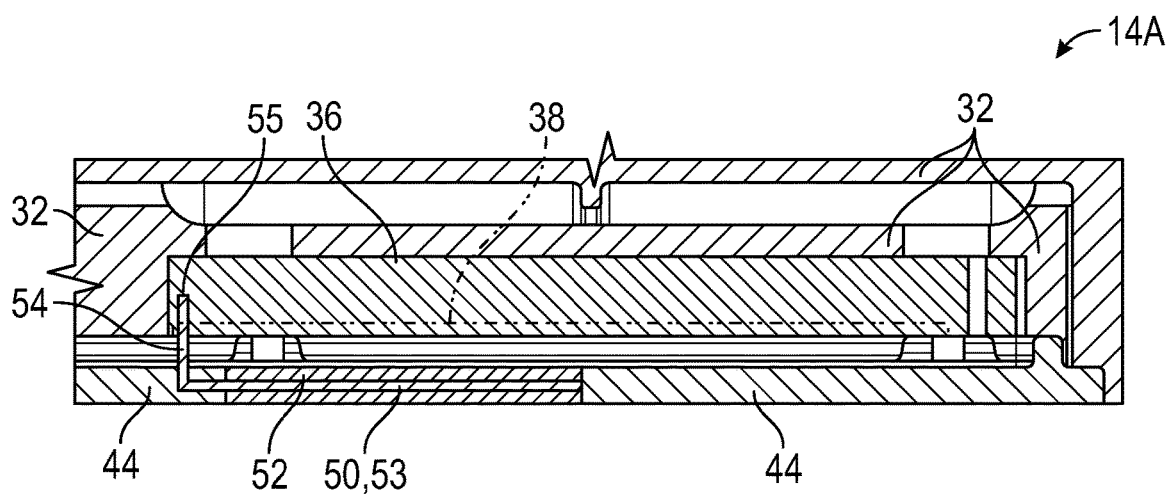
FIG. 4 is a fragmentary cross-sectional view taken at lines 4-4 in FIG. 5 of a BCMA like the BCMA of FIG. 1 modified with the directional antenna, substrate, and the integrated flexible electric connector of FIG. 3 and embedded in a module cover.
Figure 5:
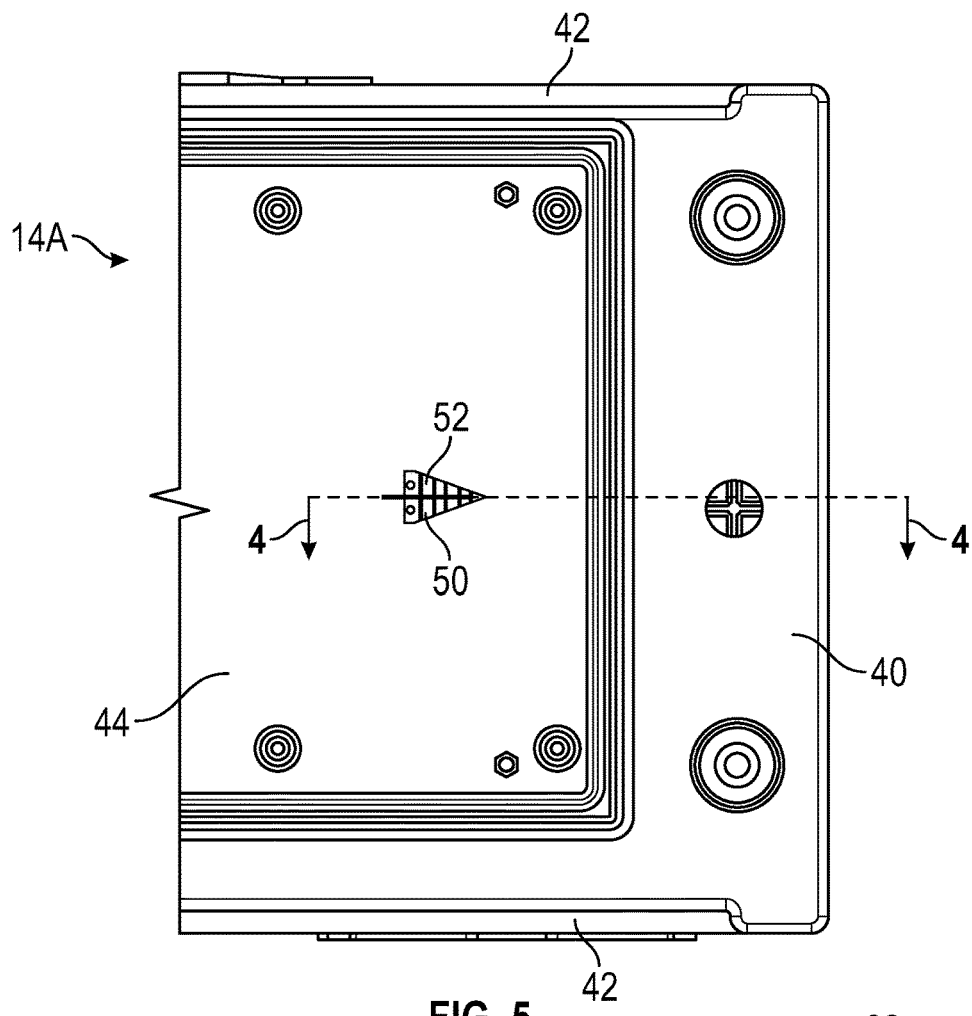
FIG. 5 is a fragmentary bottom view of the BCMA of FIG. 4.

FIGS. 4 and 5 show the directional antenna 50 integrated in the substrate 52 which is in turn integrated in the module cover 44. In other embodiments, the directional antenna 50 could instead be integrated in the interconnect board 32 or the housing of the radio frequency manager 16. The BCMA of the RESS 12 that includes this implementation of the directional antenna 50 is referred to as BCMA 14A. The substrate 52 is embedded in the module cover 44, which is a different material than the substrate. For example, the substrate 52 is a first material, and the module cover 44 is a second material, and the first material has a higher dielectric constant than the second material and a lower loss tangent that the second material. The first material may be, for example, silicone rubber or a ceramic laminate (e.g., alumina, polytetrafluoroethylene (PTFE) ceramic or other). The second material may be, for example, polypropylene, nylon, or polycarbonate. To embed the substrate 52 in the module cover 44 by overmolding the second material, the substrate 52 is held with pins at the retention features 56 within a mold for the module cover 44 to orient the directional antenna 50 in a direction to achieve high gain and direct the radio frequency signal through the low loss region of the BCMA 14A. Because the packaging envelope of the directional antenna 50 within the substrate 52 is known and is relatively small in comparison to the module cover 44 (e.g., the outer dimensions of the substrate 52 are known), its position within the mold of the module cover 44 to achieve the desired signal is design flexible and relatively inexpensive to achieve. In contrast, if the directional antenna 50 was to be incorporated in the printed circuit board 38 of the cell monitoring unit 36, this could entail more expense to reconfigure the printed circuit board 38 for different positions of the directional antenna 50 when used in different layouts of the battery pack 15 within a powertrain (e.g., different relative orientations of the cell monitoring unit 36 and the radio frequency manager 16).

As shown in FIG. 4, the electrical connector 54 extends out of the substrate 52 from the conductive line 53 and is embedded with the substrate 52 in the module cover 44 such that an end 55 of the electrical connector 54 extends out of the module cover 44 and is connectable to the cell monitoring unit 36. For example, the electrical connector 54 may be a flexible connector such as a soldered pin, a jumper wire cable (sometimes referred to as a Dupont connector), a micro-miniature coaxial connector (MMCX), or a microstrip to co-planar connection. Accordingly, data from the battery cells 30 is relayed by electrical signals from the cell monitoring unit 36 through the electrical connector 54 and out through the antenna 50 as a radio frequency signal S (indicated in FIG. 1) by wireless connection to the radio frequency manager 16.

Figure 6:
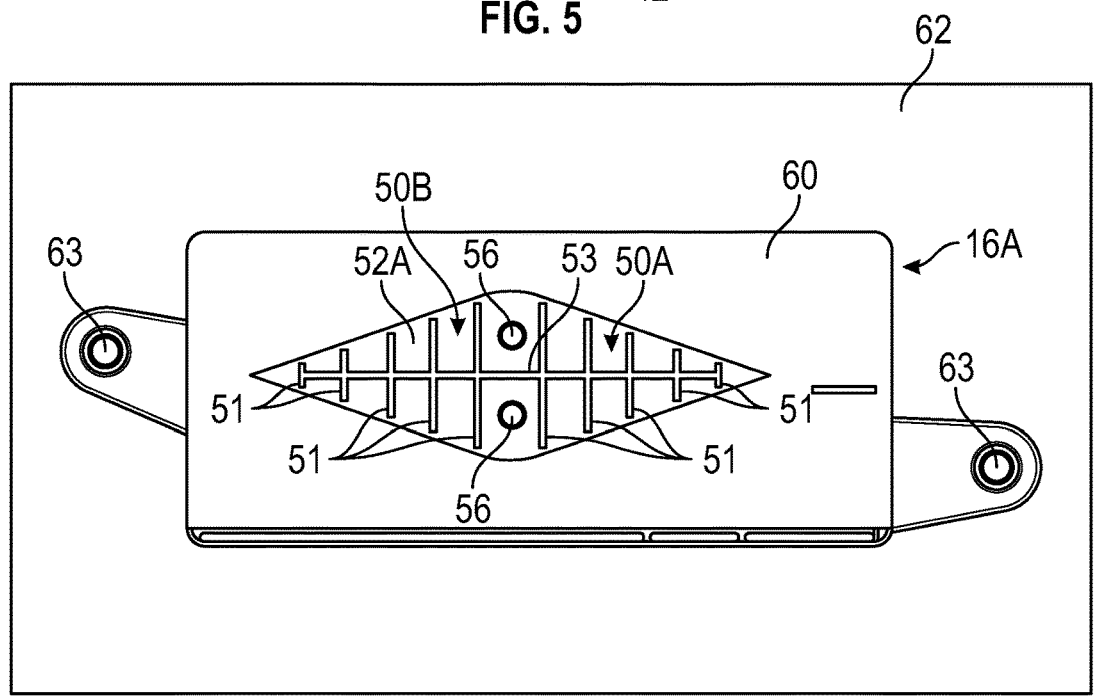
FIG. 6 is a plan view of a radio frequency manager like the radio frequency manager of FIG. 1 modified to include a pair of directional antennas integrated in a substrate embedded in a housing of the radio frequency manager, with the radio frequency manager shown mounted on a battery pack enclosure.

FIG. 6 is a plan view of a radio frequency manager 16A with a pair of directional antennas 50A, 50B. The antennas 50A, and 50B are referred to as a pair of directional antennas or dual directional antennas, and are integrated in a substrate 52A that is the same as substrate 52 as described with respect to FIG. 3 except having a different shape to accommodate two directional antennas 50A, 50B. The substrate 52A is embedded in a housing 60 of the radio frequency manager, such as by overmolding. With this implementation of the directional antennas 50A, 50B in the housing 60, the radio frequency manager 16 of FIG. 1 is referred to as radio frequency manager 16A. The housing 60 may be a different material than the substrate 52A. For example, the substrate 52A is a first material, and the housing 60 is a second material, which may be the same or different than the material of the module cover 44. The first material has a higher dielectric constant than the second material and a lower loss tangent than the second material. The first material may be silicone rubber or a ceramic laminate (e.g., alumina, polytetrafluoroethylene (PTFE) ceramic or other). The second material may be, for example, polypropylene, nylon, or polycarbonate. The directional antennas 50A, 50B are shown integrated in a single substrate 52A with a pair of retention features 56 configured as apertures and usable to orient both directional antennas 50A, 50B simultaneously. Alternatively, each antenna 50A, 50B could be integrated in a separate substrate 52, each having retention features 56 (for a total of four retention features 56, for example), and the substrates 52 could be placed to abut one another when embedding the substrates 52 in the housing 60.

The radio frequency manager 16A is shown mounted on structure such as a cage 62 of the battery pack 15. Bolts 63 are shown securing the housing 60 to the cage 62. The radio frequency manager 16A may be located in an area that is accessible for maintenance. The radio frequency manager 16A may be designed to communicate with different configurations of battery cell module assemblies used on different battery packs. Because it may be a common apparatus used with different battery cell module assembly architectures, economies of scale are achieved if it can be adapted to communicate via radio frequency signals directed over the low loss region of the different battery packs. Accordingly, the radio frequency manager 16A may be in different locations on the different battery pack platforms relative to the components of the cell monitoring units with which it communicates. By configuring the signal directing component as a pair of directional antennas 50A, 50B in the radio frequency manager 16A oriented with their high gain directions opposed to one another, one of the directional antennas may achieve communication over the low loss region even when the radio frequency manager 16A is disposed on one side of the BCMAs 14, 14A, 14B, 14C, 14D, or 14E in one application, and on an opposing side of the BCMAs 14, 14A, 14B, 14C, 14D, or 14E or a different one of the BCMAs 14, 14A, 14B, 14C, 14D, or 14E in another application. The bidirectional antenna 50A, 50B may not be as effective as a single directional antenna in some implementations as half of the signal (the signal pattern of one of the two antennas) may be effectively wasted. However, it may be easier to implement than would be producing two different radio frequency modules each having a single directional antenna, one directed in a first direction, and the other directed in an opposite direction for use with the different arrangements of the battery packs. Additionally, it may be useful in dual manager systems (e.g., a battery pack having two separate radio frequency managers), as each antenna 50A, 50B may be configured to be in radio frequency communication with different ones of the BCMAs.

Figure 7:
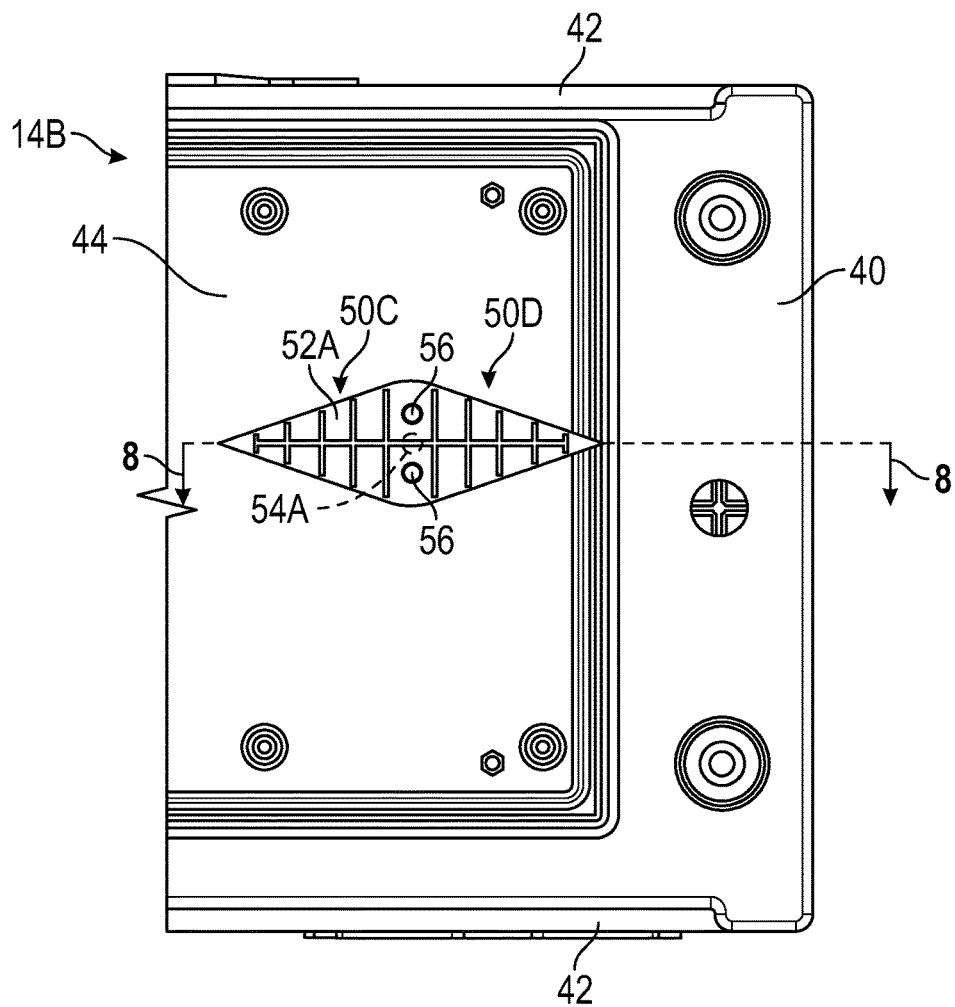
FIG. 7 is a fragmentary bottom view of a BCMA like the BCMA of FIG. 1 modified to include a pair of directional antennas integrated in a substrate embedded in a module cover and an integrated flexible electrical connector extending from the pair of directional antennas.

FIG. 7 is a fragmentary bottom view of a BCMA 14B, like BCMA 14 of FIG. 1, and including a pair of directional antennas 50C, 50D integrated in a substrate 52A like that of FIG. 6. For purposes of the description, directional antenna 50C will be referred to as a first directional antenna, and directional antenna 50D will be referred to as a second directional antenna. The directional antennas 50C, 50D are oriented with high gain directions opposed to one another, like antennas 50A, 50B of FIG. 6, but unlike the directional antennas 50A, 50B, only one of the directional antennas 50C, 50D is activated in order to preserve signal strength. More specifically, the directional antenna 50C or 50D that results in a stronger radio frequency signal between the cell monitoring unit 36 and the radio frequency manager 16 (or radio frequency manager 16A, 16B, or 16C, if used therewith), is an enabled directional antenna, and the other directional antenna 50C or 50D is an inactive directional antenna.

Figure 8:
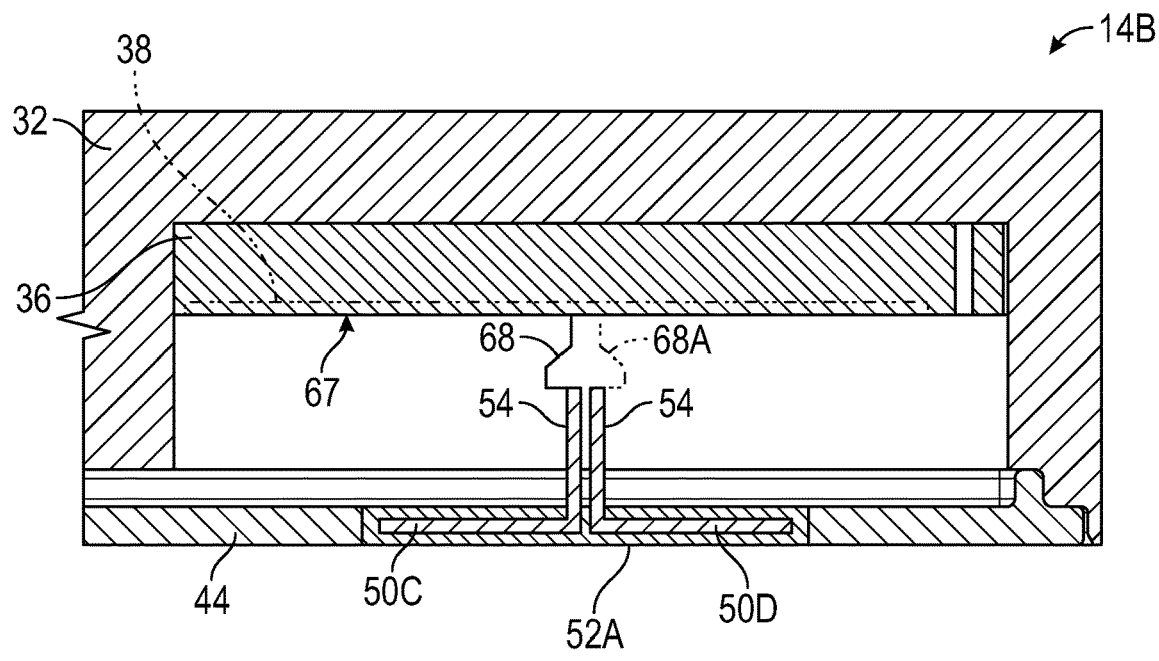
FIG. 8 is a fragmentary cross-sectional view of the BCMA of FIG. 7 taken at lines 8-8 in FIG. 7 including the pair of directional antennas and a switch to separately connect each directional antenna to a printed circuit board of a cell monitoring unit.

Activating the correct one of the directional antennas 50C, 50D is accomplished in one of several different ways. For example, as shown in FIG. 8, an integrated switch 68 may be disposed on the printed circuit board 38 of the cell monitoring unit 36. The switch 68 is shown schematically for purposes of explanation in a gap between the printed circuit board 38 and the module cover 44 (gap shown enlarged for purposes or illustration), and may be on the surface 67 of the printed circuit board 38 (e.g., disposed horizontally into the page). The switch 68 has a first position (shown in solid) in which the switch 68 closes a circuit between certain electrical components of the printed circuit board 38 and the first directional antenna 50C, but no power is provided to the second directional antenna 50D when the switch 68 is in the first position. The switch 68 may instead be moved to a second position 68A (shown in phantom) to close a circuit between other electrical components of the printed circuit board 38 and the second directional antenna 50D, but no power is provided to the first directional antenna 50C when the switch 68 is in the second position 68A. To determine the position of the switch 68, a controller such as controller 28, may be programmed to, at first start of the vehicle powertrain 10, select the switch position to power the directional antenna 50C or 50D that yields a stronger signal at the radio frequency manager 16, 16A, 16B, or 16C. A program stored on the controller 28 may move the switch 68 to each position temporarily to test the strength of the signal from each directional antenna 50C, 50D. Alternatively, the stored program may select the switch position based on other data, such as data indicative of the relative locations of the BCMA 14B and the radio frequency manager 16, 16A, 16B, or 16C.

As another alternative, instead of a switch 68, a zero ohm resistor may be provided that may be manually connected to close only the circuit that results in activating the directional antenna 50C or 50D that is closer to the radio frequency manager 16, 16A, 16B, or 16C, while another zero ohm resistor can be removed to open the circuit to the other directional antenna 50C or 50D, thereby defeating (deactivating) that antenna. In still another alternative, different respective strip lines may be provided the different directional antennas 50C, 50D, and then electrical power need only be provided along the strip line to that one of the directional antennas 50C, 50D that provides the stronger radio frequency signal with lower losses (e.g., the radio frequency signal being directed over a relatively low loss region).

The connection via a switch or a zero ohm resistor may be done before integrating the directional antennas 50C, 50D and substrate 52A in the module cover 44, or at the time of integration. For example, an inventory of BCMAs 14B may be modified so that half have the directional antenna 50C activated and the directional antenna 50D inactive, while the other half have the directional antenna 50D active and the directional antenna 50C inactive. An inventory of each type is then ready for assembly in battery packs 15 having different relative positions of the BCMA 14B and the radio frequency manager 16, 16A, 16B, or 16C.

Figure 9:
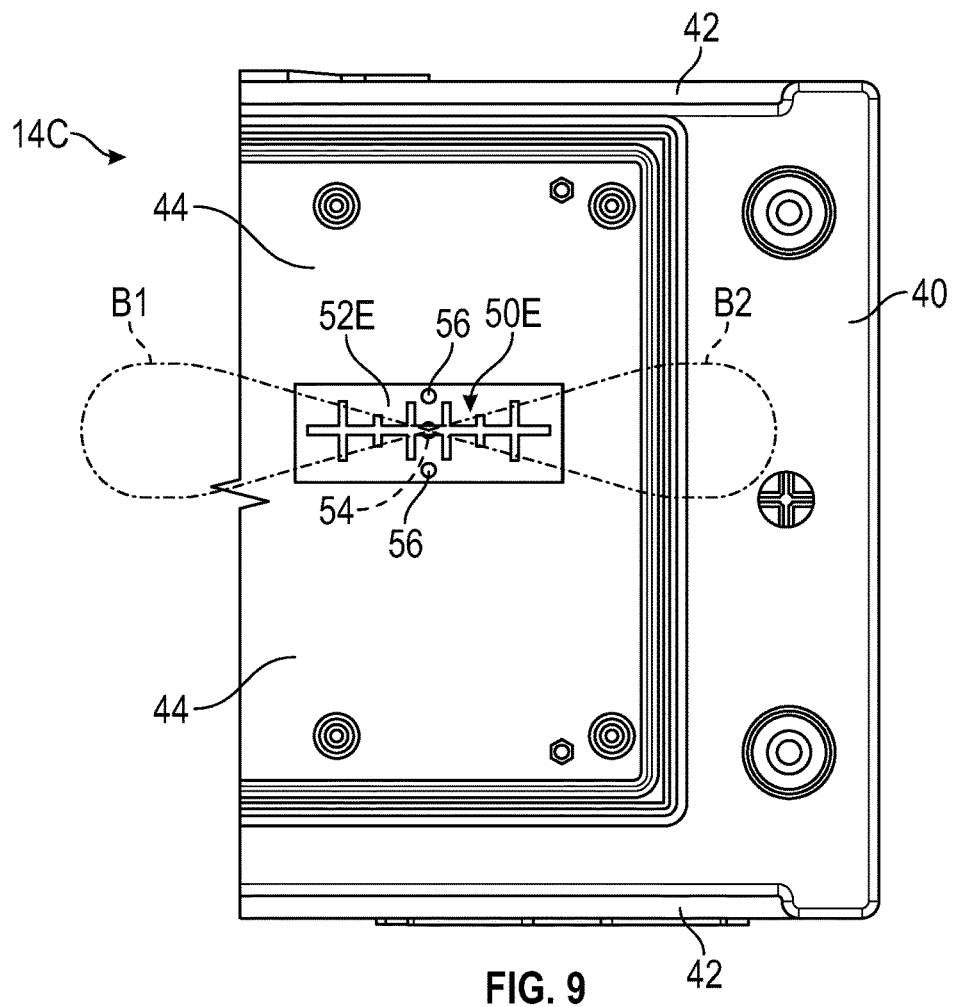
FIG. 9 is a fragmentary bottom view of a BCMA like the BCMA of FIG. 1 modified to include a bidirectional antenna integrated in a substrate embedded in a module cover and an integrated flexible electrical connector extending from the bidirectional antenna.

FIG. 9 is a fragmentary bottom view of a BCMA 14C like the BCMA 14 of FIG. 1 modified to include a signal directing component configured as a bidirectional antenna 50E having a bidirectional beam. The bidirectional antenna 50E is integrated in a substrate 52E similar to substrate 52 but having a different outer shape. An integrated flexible electrical connector 54 (not shown in FIG. 9, but like that shown in FIG. 4) may extend from the bidirectional antenna 50E and out of the substrate 52E so that it has a portion embedded in the substrate 52E and an end that connects to the printed circuit board 38 similar to as shown in FIG. 4. The bidirectional antenna 50E is referred to as a bidirectional antenna as it radiates or receives most of its energy in only two opposing directions (e.g., opposing beams in two opposing high-gain directions). The two opposing beams are indicated in phantom as a first beam B1 and a second beam B2. As with the dual directional antennas 50A and 50B of FIG. 6, the bidirectional antenna 50E enables a low loss path for the radio frequency signal to be achieved regardless of which side of a vehicle's center line the bidirectional antenna 50E is disposed on after installation of the battery pack 15 in the vehicle, as one of the beams B1 or B2 will be in closer proximity to the radio frequency manager 16, 16A, 16B, or 16C than the other beam B1 or B2 in any orientation.

Figure 10:
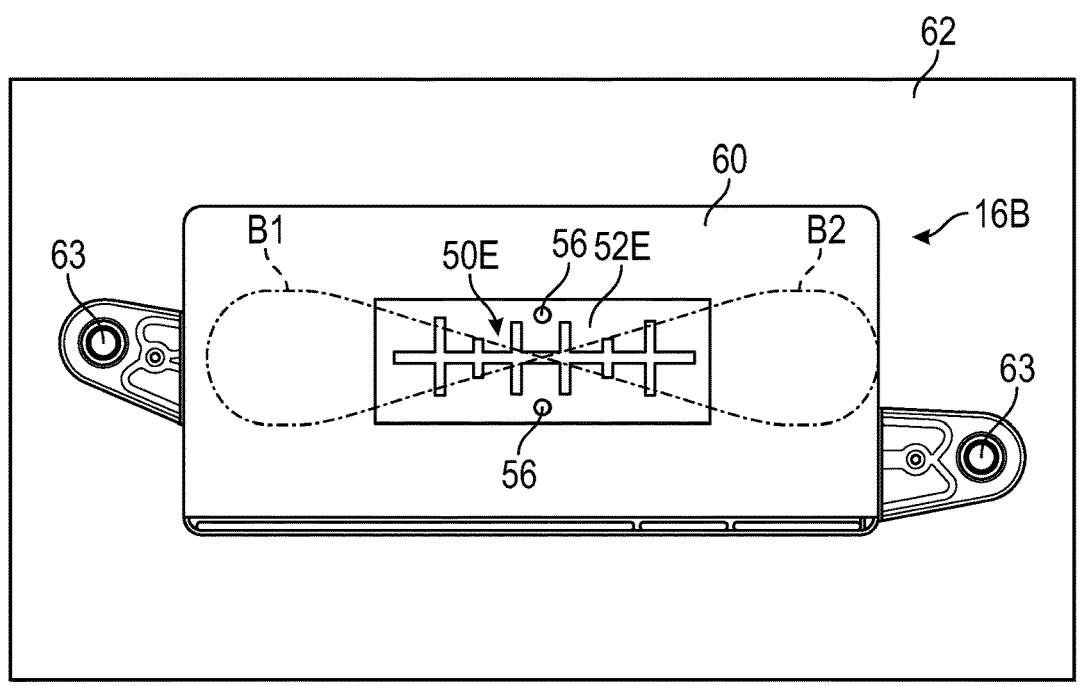
FIG. 10 is a plan view of a radio frequency manager like the radio frequency manager of FIG. 1 modified to include a bidirectional antenna integrated in a substrate embedded in a housing of the radio frequency manager.

FIG. 10 is a plan view of a radio frequency manager 16B including the bidirectional antenna 50E of FIG. 9 having a bidirectional beam B1, B2 integrated in the substrate 52E embedded in the housing 60 of a radio frequency manager 16B. Integrating the bidirectional antenna 50E in the housing 60 may result in improved packaging as the radio frequency manager 16B may be placed in an easily accessible area of the vehicle. Using a bidirectional antenna 50E on the radio frequency manager 16B has the advantage of improving the reception of radio frequency signals from nodes of the cell monitoring unit 36 regardless of the layout of the battery pack 15. Additionally, a bidirectional antenna 50E may be useful in dual manager systems (e.g., a rechargeable energy storage system having two battery radio frequency managers), as each beam B1 and B2 may be in radio frequency communication with different sets of the battery cell module assemblies.

Figure 11:
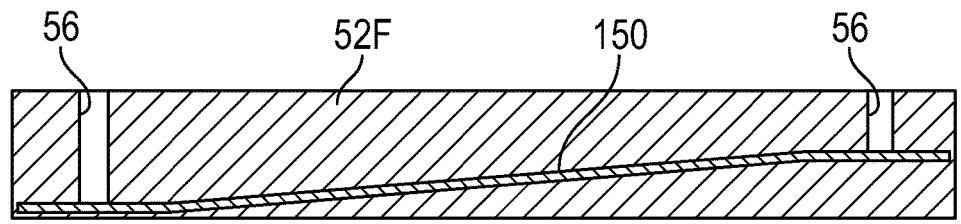
FIG. 11 is a cross-sectional side view of a signal directing component configured as a reflector, the reflector integrated in a substrate.
Figure 12:
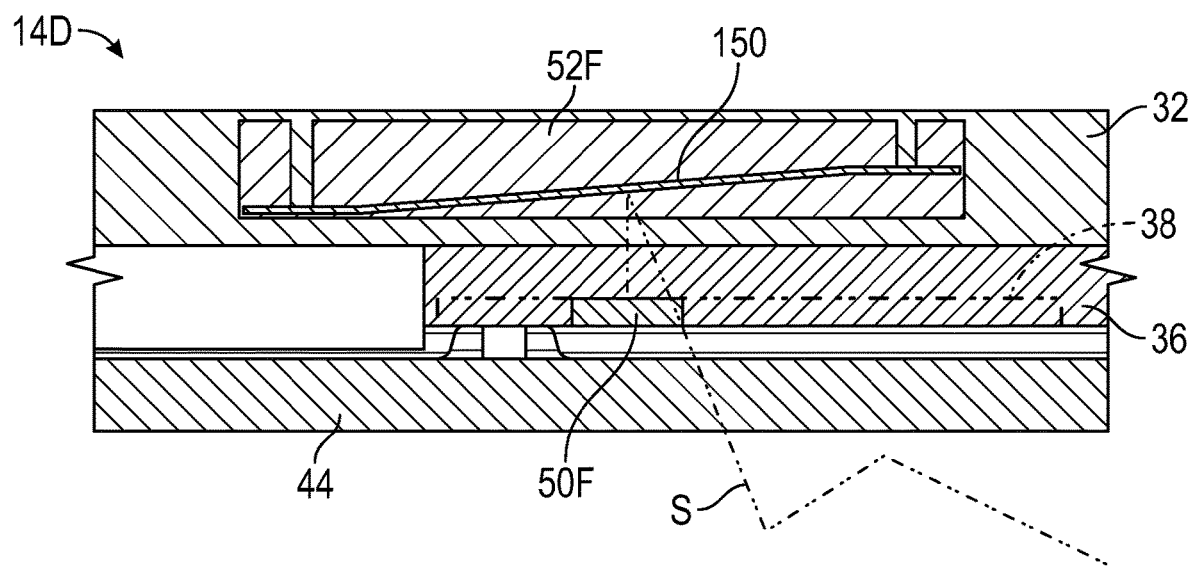
FIG. 12 is a fragmentary cross-sectional view of a BCMA like the BCMA of FIG. 1 modified to include the reflector of FIG. 11 with the substrate embedded in an interconnect board and an antenna embedded in a cell monitoring unit, the reflector directing the radio frequency signal from the antenna.

FIG. 11 is a cross-sectional side view of a signal directing component configured as a reflector 150 integrated in a substrate 52F. More specifically, the reflector 150 is embedded in the substrate 52F. Retention features such as the apertures 56 are provided in the substrate 52F to maintain a desired orientation of the substrate 52F and the reflector 150 when the substrate 52F is overmolded in the interconnect board 32 of the BCMA 14D of FIG. 12. In this position, the reflector 150 is inward of an antenna 50F embedded in the printed circuit board 38 of the cell monitoring unit 36 and is oriented such that a radio frequency signal S to or from the antenna 50F is redirected by the reflector 150 through a relatively low loss region of the battery pack 15 for communication with the radio frequency manager 16, 16A, 16B, or 16C.

Figure 13:
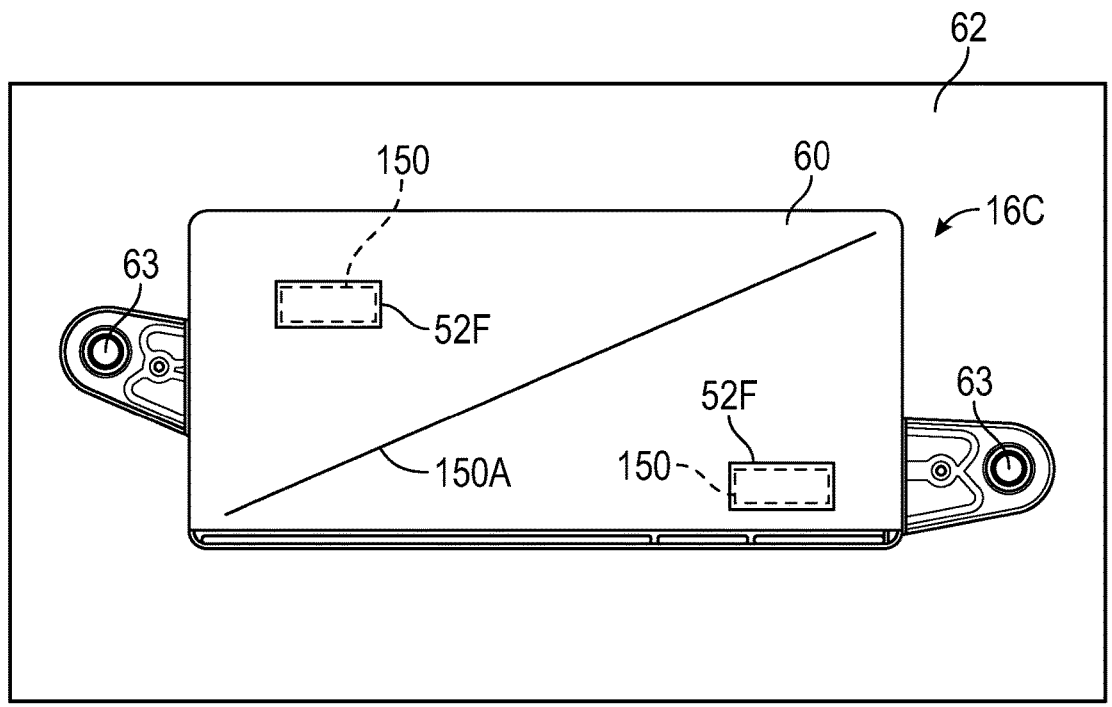
FIG. 13 is a plan view of a radio frequency manager like the radio frequency manager of FIG. 1 modified to include with multiple reflectors integrated in substrates as in FIG. 10 and embedded in a housing of the radio frequency manager.

FIG. 13 is a plan view of a radio frequency manager 16C like radio frequency manager 16 of FIG. 1 modified with multiple reflectors 150 each integrated in a substrate 52F like substrate 52, which is then embedded in the housing 60 of the radio frequency manager 16C so that each is below an antenna in the housing 60 of the radio frequency manager 16C (e.g., each reflector 150 is closer to the lower cover of the housing 60 underneath the antennas). By providing two separate reflectors 150 at different locations on the housing 60, the same configuration of the radio frequency manager 16C may be used for different battery pack 15 configurations in which the multiple BCMAs 14, 14A, 14B, 14C, 14D, or 14E are disposed in different locations relative to the radio frequency manager 16C so that the radio frequency signals may be transmitted along different low loss regions of the different battery pack configurations to the radio frequency manager 16C. As another alternative, a single reflector could be disposed within the housing 60 of the radio frequency manager 16 and arranged diagonally along line 150A in a plane going into the page of FIG. 13. In this arrangement, the single diagonal reflector may direct the signal from both of the antennas within the housing 60 along a relatively low loss path.

Figure 14:
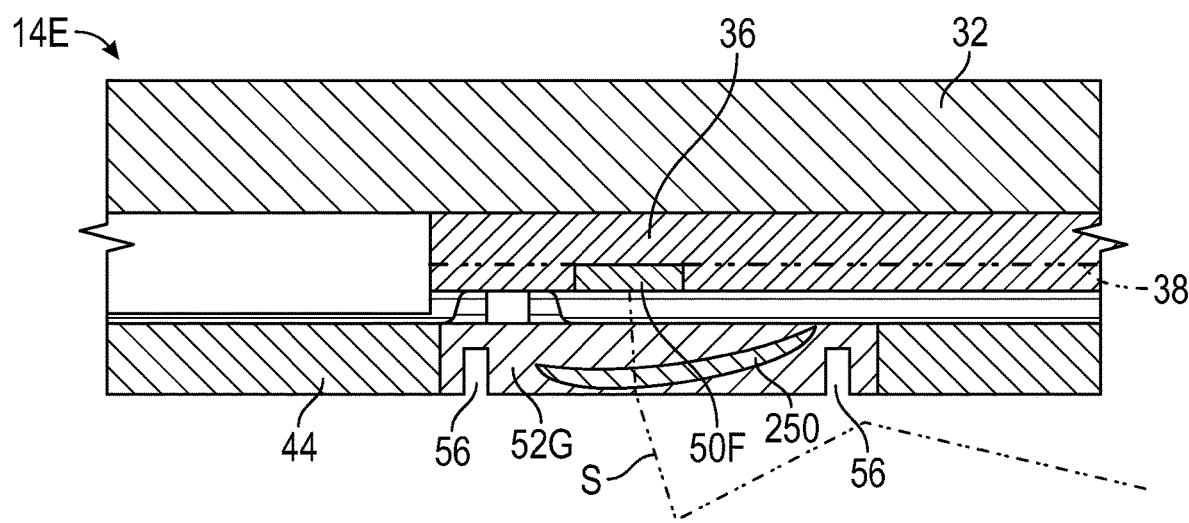
FIG. 14 is a fragmentary cross-sectional view of a BCMA like the BCMA of FIG. 1 modified to include a lens integrated in a substrate, the substrate embedded in a module cover, and an antenna embedded in a cell monitoring unit with the lens directing the radio frequency signal.

FIG. 14 is a fragmentary cross-sectional view of a BCMA 14E including a signal directing component configured as a lens 250 integrated in a substrate 52G of the material of substrate 52, the substrate 52G having the retention features 56 for use when embedding the substrate 52G in the module cover 44, for example. The lens 250 may be, for example, a Luneburg lens. The lens 250 is oriented and has a geometry determined by the radio frequency analysis to allow it to direct the radio frequency signal S from the antenna 50F embedded in the printed circuit board 38 of the cell monitoring unit 36 over the predetermined low loss region of the BCMA 14E to the radio frequency manager 16, 16A, 16B, or 16C.

It should be appreciated that any of the signal directing components described as being integrated in one of the components of the BCMAs 14, 14A, 14B, 14C, 14D, or 14E (e.g., the directional antenna 50, the pair of directional antennas 50A, 50B, the bidirectional antenna 50E, the reflector 150, or the lens 250) may be used in combination with any of the signal directing components described as being integrated in the radio frequency manager 16, 16A, 16B, or 16C (e.g., the directional antenna 50, the pair of directional antennas 50A, 50B, the bidirectional antenna 50E, the reflector 150, or the lens 250) to even further increase the radio frequency communication signal strength and decrease signal losses in the battery pack 15.

A method 300 of manufacturing a rechargeable energy storage system RESS 12 as described herein is shown in Table I.

TABLE I

| 300 | Method of manufacturing a rechargeable energy storage system |
| 310 | Conduct radio frequency analysis |
| 312 | Integrate signal directing component into substrate |

TABLE I-continued

| 314 | Integrate signal directing component into module cover, interconnect board or radio frequency manager |
| | 316 Orient signal directing component to direct signal through low loss region |
| | 318 Embed substrate in module cover, interconnect board or radio frequency manager |
| 320 | Connect integral electrical connector with cell monitoring unit |
| 322 | Determine which directional antenna of a pair of directional antennas results in a stronger radio frequency signal |
| 324 | Enable radio frequency path to only one directional antenna of pair with opposing high gain directions |

The method 300 may include step 310, conducting radio frequency analysis to determine the relatively low loss region of the battery pack 15. For example, an off-the shelf omnidirectional antenna included in a printed circuit board 38 may be used for this purpose.

In some implementations, the method 300 may include step 312, integrating a signal directing component 50, 50A, 50B, 50C, 50D, 50E, 150, or 250 into a substrate 52, 52A, 52E, 52F, or 52G that is a material having a relatively high dielectric constant and a relatively low loss tangent (e.g., in comparison to the material of component in which it is later integrated).

After step 312, the method 300 includes step 314, integrating the signal directing component 50, 50A, 50B, 50C, 50D, 50E, 150, or 250 operable for transmitting and/or receiving a radio frequency signal between a cell monitoring unit 36 of a BCMA 14, 14A, 14B, 14C, 14D, or 14E and a radio frequency manager 16, 16A, 16B, or 16C into one of a module cover 44 of the BCMA, an interconnect board 32 of the BCMA, or the radio frequency manager 16, 16A, 16B, or 16C. Step 314 may include a substep 316, orienting the signal directing component 50, 50A, 50B, 50C, 50D, 50E, 150, or 250 in the module cover 44, the interconnect board 32, or the radio frequency manager 16, 16A, 16B, or 16C to direct the radio frequency signal through a relatively low loss region for radio frequency signal communication of the battery pack 15. For example, retention features 56 of the substrate 52, 52A, 52E, 52F, or 52G may be held to orient the signal directing component 50, 50A, 50B, 50C, 50D, 50E, 150, or 250. Step 314 may also include substep 318, embedding the substrate 52, 52A, 52E, 52F, or 52G in the one of the module cover 44, the interconnect board 32, or the radio frequency manager 16, 16A, 16B, or 16C. The substrate 52, 52A, 52E, 52F, or 52G may be a first material, and the module cover 44, the interconnect board 32, or the radio frequency manager 16, 16A, 16B, or 16C in which the substrate is embedded may be a second material, and the first material may have a higher dielectric constant than the second material and a lower loss tangent that the second material.

An integral, flexible electrical connector 54 may extend from the signal directing component 50, 50A, 50B, 50C, 50D, 50E, and the method 300 may include step 320, connecting the integral, flexible electrical connector 54 to the printed circuit board 38 of the cell monitoring unit 36 after integrating the signal directing component.

In some implementations, the signal directing component may be a pair of directional antennas 50C, 50D oriented with high gain directions opposed to one another, the pair including a first directional antenna 50C and a second directional antenna 50D, and the method 300 may include step 322, determining which one of the first directional antenna 50C and the second directional antenna 50D results in a stronger radio frequency signal between the cell monitoring unit 36 and the radio frequency manager 16, 16A, 16B, or 16C. Next, the method 300 may include step 324, enabling a radio frequency path between the cell monitoring unit 36 and the radio frequency manager 16, 16A, 16B, or 16C for only that one of the first directional antenna 50C and the second directional antenna 50D that resulted in the stronger radio frequency signal, by, for example, closing a switch or connecting a zero ohm resistor.

Accordingly, the rechargeable energy storage systems and methods of manufacturing disclosed herein utilize one or more signal directing components, such as an antenna, a reflector, or a lens, for directing radio frequency signals between a cell monitoring unit and a radio frequency manager with greater signal strength, relatively low loss, improved packaging space, and ability to be utilized in different battery pack configurations and layouts.

While the best modes for carrying out the disclosure have been described in detail, those familiar with the art to which this disclosure relates will recognize various alternative designs and embodiments for practicing the disclosure within the scope of the appended claims.

What is claimed is:

1. A rechargeable energy storage system comprising:
   a battery pack including a battery cell module assembly and a radio frequency manager, the battery cell module assembly having:
      a plurality of battery cells,
      a cell monitoring unit having a printed circuit board configured to monitor one or more parameters of the battery cells,
      an interconnect board disposed between the plurality of battery cells and the cell monitoring unit and physically connecting the plurality of battery cells with the cell monitoring unit, and
      a module cover at least partially enclosing the plurality of battery cells, the cell monitoring unit, and the interconnect board, with the cell monitoring unit disposed adjacent to the module cover;
   wherein the radio frequency manager is wirelessly connectable to the cell monitoring unit by radio frequency signal communication; wherein the battery cell module assembly has a high loss region and a low loss region, the low loss region resulting in a lower loss in radio frequency signal strength than the high loss region;
   a signal directing component operable for transmitting and/or receiving a radio frequency signal between the cell monitoring unit and the radio frequency manager and configured to direct the radio frequency signal to the low loss region, the signal directing component integrated in one of the module cover, the interconnect board, or the radio frequency manager,
   a substrate embedded in the one of the module cover, the interconnect board, or the radio frequency manager; and
   wherein the signal directing component is integrated with the substrate.

2. The rechargeable energy storage system of claim 1, wherein the substrate has retention features operable to retain the substrate in a fixed position during embedding of the substrate in the one of the module cover, the interconnect board, or the radio frequency manager.

3. The rechargeable energy storage system of claim 1, wherein the substrate is a first material, the one of the module cover, the interconnect board, or the radio frequency manager in which the substrate is embedded is a second material, and the first material has a higher dielectric constant than the second material and a lower loss tangent than the second material.

4. The rechargeable energy storage system of claim 1, further comprising:
   an electrical connector extending out of the substrate from the signal directing component and embedded with the substrate in the module cover or the interconnect board such that an end of the electrical connector extends out of the module cover or the interconnect board and is connectable to or through the cell monitoring unit.

5. The rechargeable energy storage system of claim 1, further comprising:
   an additional signal directing component wherein the additional signal directing component is a directional antenna integrated in the module cover.

6. The rechargeable energy storage system of claim 1, further comprising:
   an additional signal directing component wherein the additional signal directing component is a pair of directional antennas oriented with high gain directions opposed to one another and integrated in the radio frequency manager.

7. The rechargeable energy storage system of claim 1, further comprising:
   an additional signal directing component wherein the additional signal directing component is a pair of directional antennas oriented with high gain directions opposed to one another, the pair of directional antennas including an enabled directional antenna and an inactive directional antenna.

8. The rechargeable energy storage system of claim 7, wherein the pair of directional antennas are integrated in the module cover.

9. The rechargeable energy storage system of claim 7, wherein the pair of directional antennas are integrated in the radio frequency manager.

10. The rechargeable energy storage system of claim 1, wherein the signal directing component is a bidirectional antenna integrated in the module cover.

11. The rechargeable energy storage system of claim 1, further comprising:
    an additional signal directing component wherein the additional signal directing component is a bidirectional antenna integrated in the radio frequency manager.

12. The rechargeable energy storage system of claim 1, further comprising:
    an additional signal directing component wherein:
    the additional signal directing component is a reflector integrated in the interconnect board;
    the printed circuit board of the cell monitoring unit includes an antenna; and
    the reflector is oriented to direct the radio frequency signal from the antenna of the printed circuit board of the cell monitoring unit to the low loss region.

13. The rechargeable energy storage system of claim 1, further comprising:
    an additional signal directing component wherein:
    the radio frequency manager includes a printed circuit board with an antenna, and a housing disposed adjacent the printed circuit board of the radio frequency manager; and
    the additional signal directing component is a reflector integrated in the housing of the radio frequency manager and oriented to direct the radio frequency signal from the antenna of the printed circuit board of the radio frequency manager to the low loss region.

14. The rechargeable energy storage system of claim 1, further comprising:
an additional signal directing component wherein:
the additional signal directing component is a lens integrated in the module cover;
the printed circuit board of the cell monitoring unit includes an antenna; and
the lens is oriented to direct the radio frequency signal from the antenna of the printed circuit board to the low loss region.

15. A method of manufacturing a rechargeable energy storage system, the method comprising:
conducting radio frequency analysis to determine a low loss region of a battery cell module assembly;
wherein the battery cell module assembly has a high loss region and the low loss region, the low loss region resulting in a lower loss in radio frequency signal strength than the high loss region; and
after conducting the radio frequency analysis, integrating a signal directing component operable for transmitting and/or receiving a radio frequency signal between a cell monitoring unit of a battery cell module assembly of a battery pack and a radio frequency manager of the battery pack into one of a module cover of the battery cell module assembly, an interconnect board of the battery cell module assembly, or the radio frequency manager; wherein the interconnect board is configured to be disposed between and physically connect battery cells of the battery cell module assembly and the cell monitoring unit, the cell monitoring unit is configured to be disposed between the interconnect board and the module cover;
wherein integrating the signal directing component includes orienting the signal directing component in one of the module cover, the interconnect board, or the radio frequency manager to direct the radio frequency signal through the low loss region of the battery pack.

16. The method of claim 15, further comprising:
integrating the signal directing component with a substrate; and
wherein integrating the signal directing component into one of the module cover, the interconnect board, or the radio frequency manager is after integrating the signal directing component with the substrate, and includes embedding the substrate in the one of the module cover, the interconnect board, or the radio frequency manager;
wherein the substrate is a first material, the one of the module cover, the interconnect board, or the radio frequency manager in which the substrate is embedded is a second material, and the first material has a higher dielectric constant than the second material and a lower loss tangent than the second material.

17. The method of claim 15, wherein an integral electrical connector extends from the signal directing component; and the method further comprising:
connecting the integral electrical connector with the cell monitoring unit or the interconnect board after integrating the signal directing component.

18. The method of claim 15, wherein the signal directing component is a pair of directional antennas oriented with high gain directions opposed to one another, the pair of directional antennas including a first antenna and a second antenna, and the method further comprising:
determining which one of the first antenna and the second antenna results in a stronger radio frequency signal between the cell monitoring unit and the radio frequency manager; and
enabling a radio frequency path between the cell monitoring unit and the radio frequency manager for only that one of the first antenna and the second antenna that results in the stronger radio frequency signal between the cell monitoring unit and the radio frequency manager.

\* \* \* \* \*